(12) United States Patent
Telkamp et al.

(10) Patent No.: US 6,293,386 B1
(45) Date of Patent: Sep. 25, 2001

(54) LEADFRAME TRANSPORT AND METHOD THEREFOR

(75) Inventors: Arnold T. M. Telkamp, Velp; Richard G. T. Fierkens, Ewijk, both of (NL)

(73) Assignee: FiTel Innovations, Heerenberg (NL)

( * ) Notice: Subject to any disclaimer, the term of this patent is extended or adjusted under 35 U.S.C. 154(b) by 0 days.

(21) Appl. No.: 09/307,479

(22) Filed: May 10, 1999

(51) Int. Cl.$^7$ ................................................. B65G 21/10
(52) U.S. Cl. ................................. 198/339.1; 198/861.5
(58) Field of Search ................. 198/339.1, 861.4–861.6; 414/937, 938, 935

(56) References Cited

U.S. PATENT DOCUMENTS

| | | | |
|---|---|---|---|
| 4,951,601 | * 8/1990 | Maydan et al. | 414/935 |
| 5,820,679 | * 10/1998 | Yokoyama et al. | 414/937 |
| 5,855,465 | * 1/1999 | Boitnott et al. | 414/937 |
| 5,944,940 | * 8/1999 | Toshima | 414/937 |
| 6,051,066 | * 4/2000 | Begin | 414/937 |
| 6,120,229 | * 9/2000 | Hofmeister | 414/937 |

* cited by examiner

Primary Examiner—Christopher P. Ellis
Assistant Examiner—Mark A. Deuble
(74) Attorney, Agent, or Firm—Weiss & Moy, P.C.; Jeffrey D. Moy; Harry M. Weiss

(57) ABSTRACT

An independent leadframe transport system for use with an integrated-circuit processing has a main drive unit having at least one tool-drive. A stack unit is moveably coupled to the main drive unit for storing unprocessed and processed leadframes. A leadframe transport carousel is coupled to the stack unit which loads an unprocessed leadframe from the stack unit and returns a processed leadframe back to the stack unit.

22 Claims, 4 Drawing Sheets

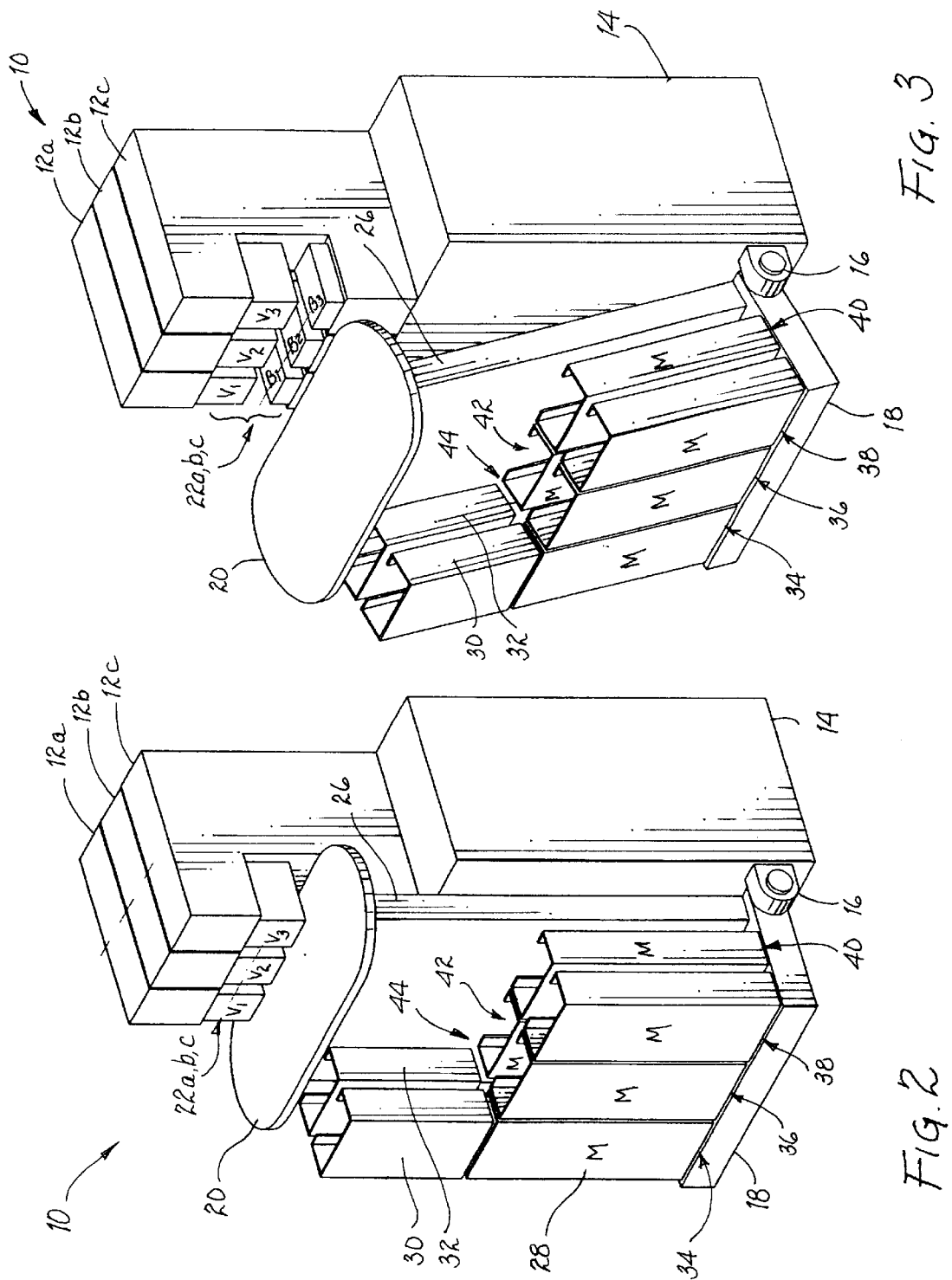

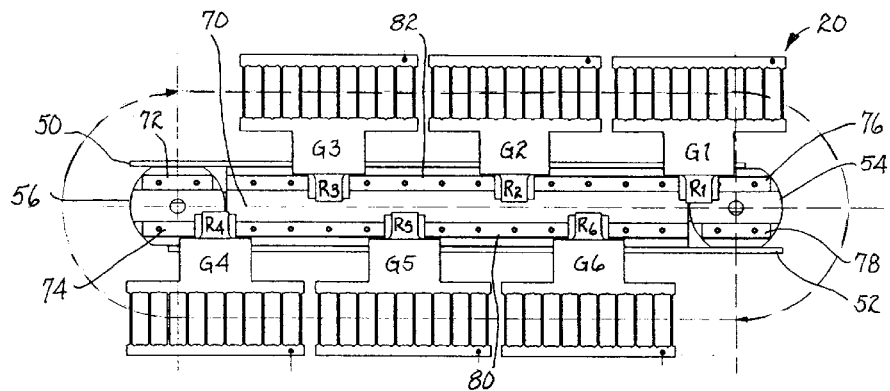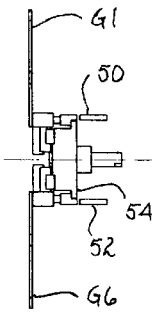
FIG. 4  FIG. 4a
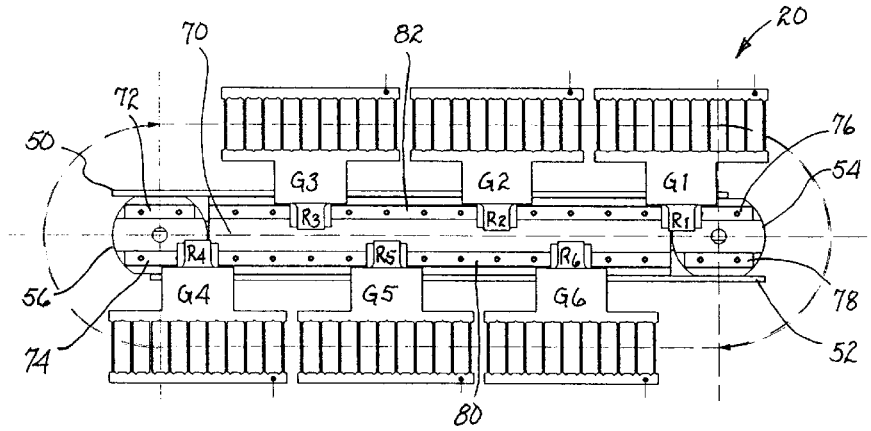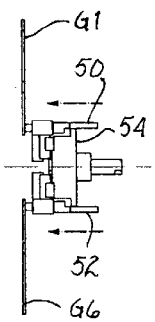
FIG. 5  FIG. 5a
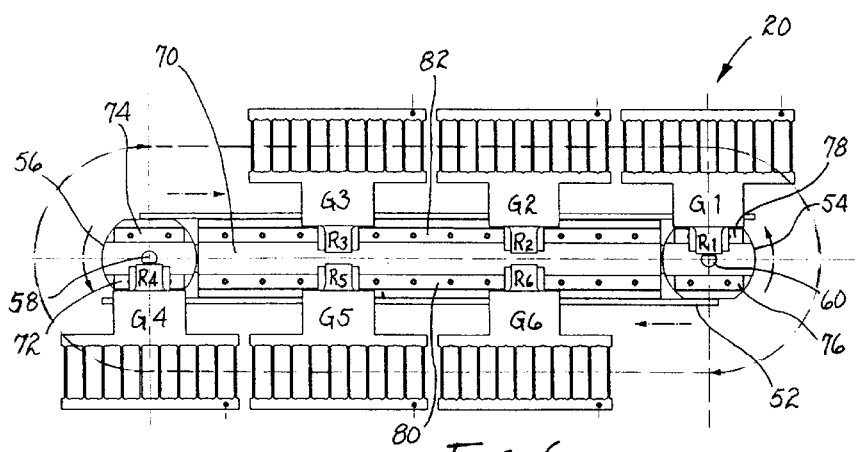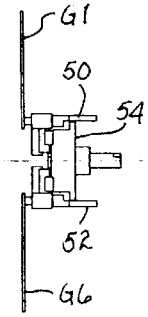
FIG. 6  FIG. 6a

LEADFRAME TRANSPORT AND METHOD THEREFOR

BACKGROUND OF THE INVENTION

1. Field of the Invention

This invention is in the field of leadframe transport systems and methods therefore, and more particularly, is an independent. leadframe transport system which is separable and independent from the tool(s), in which each leadframe is individually held by a to leadframe handler assembly thereby eliminating the stresses normally imparted to the leadframe, and a method therefor.

2. Description of the Related Art

Historically the transportation of leadframes through tool (s), used to cut, bend, mark, separate, etc., has been performed by directly manipulating and physically moving a leadframe from position to position, or from tool to tool. This direct handling of the leadframe imparts a great deal of working stress to the leadframe. In past times of large geometry integrated circuits and their correspondingly rigid leadframes, these stresses could be tolerated by the leadframe and its associated integrated circuit. However, today's technology has developed much smaller and much more dense integrated circuits. Therefore, the leadframes have also had to become correspondingly smaller, and thus are much more fragile than their predecessors. These smaller geometry, more fragile, leadframes are very susceptible to physical damage as the leadframes are directly handled by the leadframe transport system ("leadframe transport" hereinafter) and stack equipment, particularly during high speed operations, or during physical handling by human operators. Additional problems arise when the leadframe transport and tool(s) are a compact integrated unit, and when damage of a leadframe occurs, such as the bending or tearing of the leadframe. Such a deformed leadframe often results in jamming of the leadframe transport and tool(s). This jamming requires the services of an experienced technician to disassemble the leadframe transport and tool(s), remove the damaged leadframe, repair the leadframe transport and tool (s), and assemble the leadframe transport and tool(s) again. During the period of time needed to solve the jammed leadframe problem the entire integrated-circuit processing equipment ("equipment" hereinafter) is non-functional, resulting in expensive production losses due to idle equipment and lost production capacity.

A further problem due to the fragility of today's modern leadframes, is that at times it may be necessary for an operator to physically remove a leadframe from the leadframe transport for inspection. This inspection involves the direct physical handling of the leadframe by the operator. The operator must remove the leadframe from the leadframe transport by hand, conduct the inspection, and then return the leadframe to the leadframe transport. The physical handling of a leadframe by an operator easily results in very large stresses being imparted to this fragile leadframe. Additionally, alignment problems may occur between the leadframe and the tool when the operator attempts to re-insert the leadframe back into the leadframe transport.

Therefore a need existed for a leadframe transport and method to handle these new fragile leadframes to avoid irreparable and expensive damage to leadframes and the associated integrated circuit. Additionally, a need existed for a leadframe transport and method to handle these new fragile leadframes so as to prevent jamming and subsequent damage to the leadframe transport and tool(s). Yet another need existed for a leadframe transport and a method to allow the easy removal of damaged leadframes from the leadframe transport without requiring the complete disassembly of the leadframe transport and tool(s).

SUMMARY OF THE INVENTION

An object of the present invention is to provide a leadframe transport and method which can, beside the rigid leadframes, handle fragile leadframes and avoid irreparable and expensive damage to leadframes and the associated integrated circuit.

Another object of the present invention is to provide a leadframe transport and method to transport fragile leadframes so as to prevent jamming and subsequent damage to the leadframe transport and tool(s).

Yet a further object of the present invention is to provide a leadframe transport and a method to allow the easy removal of damaged leadframes from the leadframe transport and tool(s) without requiring the disassembly of the leadframe transport and tool(s).

BRIEF DESCRIPTION OF THE PREFERRED EMBODIMENTS

In accordance with one embodiment of the present invention an independent leadframe transport for use in equipment is disclosed. The independent leadframe transport is for use in equipment which comprises; a main drive unit having at least one tool-drive, a stack unit coupled to the main drive unit, and a leadframe transport carousel coupled to the stack unit and positioned proximate to the at least one tool-drive. The stack unit is translationally coupled to the main drive unit so that the leadframe transport carousel may be selectively positioned within the at least one tool-drive in an in-tool position and without the at least one tool-drive in an out-tool position.

In accordance with yet another embodiment of the present invention, a method of processing leadframes allowing the removal of the leadframe transport from the tool area of the equipment is disclosed. The method of processing leadframes allowing the removal of a leadframe transport from the tool area of the equipment comprises the steps of; providing a leadframe transport carousel adapted and configured to be coupled to a stack unit, adapting and configuring the stack unit to be translationally hinged whereby the leadframe transport carousel is selectively translated between an in-tool position within the tool area and an out-tool position without the tool area.

The foregoing and other objects, features, and advantages of the invention will be apparent from the following, more particular, description of the preferred embodiments of the invention, as illustrated in the accompanying drawings.

BRIEF DESCRIPTION OF THE DRAWING

FIG. 2 is a perspective side view of the independent leadframe transport of the present invention shown in the "in-tool" position.

FIG. 3 is a perspective side view of the independent leadframe transport of the present invention shown in the "out-tool" position.

FIGS. 4–8 are top views of the leadframe transport carousel showing the relative positions of the leadframe transport carousel components during the indexed process pitch sequence.

FIGS. 4a–8a are corresponding side looking views of the leadframe transport carousel showing the relative positions of the pitch strips and the leadframe handler assemblies during the indexed process pitch sequence.

DESCRIPTION OF THE PREFERRED EMBODIMENTS

Figure 1:
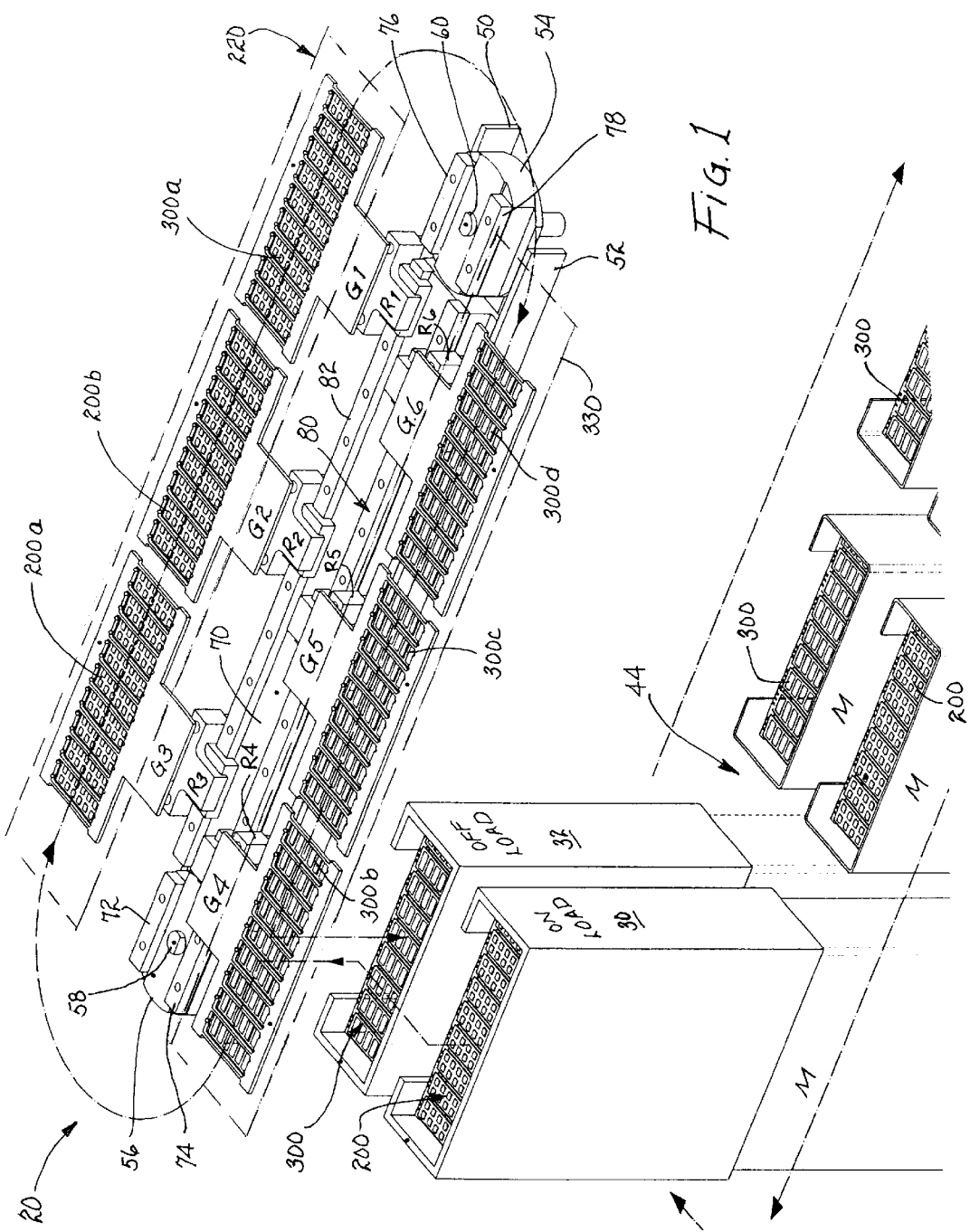
FIG. 1 is a perspective top view of the leadframe transport carousel, magazines and buffers of the independent leadframe transport of the present invention.

Due to the more fragile modern leadframes, a new method, and apparatus for handling the leadframes is presented. The new independent leadframe transport and method involves the concept that each leadframe is only gripped, or held, one time from the initial removal of a leadframe from an on-load buffer, its transport through the process area including its tool(s) and their processing, back through the return area, and to the release of the processed leadframe at the off-load buffer. This single-step handling of a leadframe avoids the physically stressful results of multiple handling events of the leadframes at the many steps from on-load to off-load that existed in the prior art. This single-step handling concept is an important feature in the use of a leadframe handler assembly. The leadframe handler assembly is key to the improved handling of leadframes because this allows handling a leadframe only one time from its initial placement into the leadframe handler assembly, and then through the remainder of the processing of the leadframe. Through this whole process, the actual operator physical and machine mechanical handling is restricted to the leadframe handler assembly, which is itself holding the leadframe. To further facilitate this concept of a method and apparatus for handling leadframes, each leadframe handler assembly is transported by a leadframe transport carousel. The leadframe carousel moves a plurality of leadframe handler assemblies through the tool(s). Yet another important feature of the present invention is the ability to translate the leadframe transport carousel out of the tool area. As discussed previously, if jamming occurs within the tool area of prior art equipment a technician must disassemble the leadframe transport and tool(s) to remove the jammed leadframe. The disassembly process is inherently stressful and damaging to the leadframes that are not jammed within the tool area Therefore, to ensure and aid in minimizing the stresses that might be imparted to a leadframe in the event of a leadframe jam, the stack assembly is designed to remove the leadframe transport carousel and its associated leadframe handlers, out of the tool area. Additionally, the feature of removing the entire leadframe transport carousel out of the tool area in the event of a jam, not only allows the easy removal of damaged leadframes from the tool area without requiring the disassembly of leadframe transport and tool(s), but also increases the accessibility to the interior of the leadframe transport and tool(s). Also, the removal of the leadframe transport carousel and the subsequent separation of a single leadframe handler assembly, holding a damaged leadframe, from the leadframe transport carousel keeps the remainder of the leadframe handler assemblies on the leadframe transport carousel for processing. And finally, when a leadframe must be removed from the leadframe transport for inspection, the physical handling bag an operator only occurs with the leadframe handler assembly thus minimizing additional stresses imparted to the leadframe itself. These and other features of the independent leadframe transport and method will become apparent in the following detailed explanation of the preferred embodiments.

Referring first to FIG. 2, a perspective side view of equipment 10 in a preferred embodiment of the present invention is shown. The equipment 10 comprises the following main components: A main drive unit 14 having at least one tool-drive unit 12. In a preferred embodiment, as shown herein, the equipment 10 has three tool-drives 12a, b and c. However the number of individual tool-drives used in the equipment 10 is variable depending on the needs and desires of the end user. While the preferred embodiment shown herein has three tool-drives, 12a, b and c, the number of tool-drives may be as few as one, and as many as six. The equipment 10 is further comprised of a stack unit 28 coupled to the main drive unit 14, and a leadframe transport carousel 20 coupled atop the stack unit 28 and positioned proximate to the tool(s) 22.

In the preferred embodiment, the stack unit 28 is translationally coupled to the main drive unit 14 so that the leadframe transport carousel 20 may be selectively positioned within the tool-drive(s) 12 in the in-tool position as shown herein. Reference to FIG. 3 will show the stack unit 28 translated such that the leadframe transport carousel 20 is without the tool-drive(s) 12 in the out-tool position. Attention is directed to the stack unit 28, hinge 16, which couples the stack unit 28 to the main drive unit 14 at the lower extremities and provides for the translation feature of the stack unit 28 and its constituent parts, including the leadframe transport carousel 20, between the in-tool position, shown in FIG. 2, and the out-tool position, shown in FIG. 3. The hinge 16 is a key component in the leadframe transport and method for translating the leadframe transport carousel 20 from the in-tool position in which the leadframe handler assemblies are within the tool-drives 12, to the out-tool position in which the leadframe handler assemblies are without the tool-drive(s) 12. In a preferred embodiment, the translation is a rotation about the hinge 16. Alternative embodiments addressing the translation of the stack unit may also include however, a linear translation of the stack unit 28 between the in-tool position, and the out-tool position (not shown herein); or a rotation of the stack unit 28 about a vertical axis parallel to the main drive unit 14 (not shown herein).

Referring to FIGS. 2 and 3, it is shown that each tool-drive 12a, b and c is also comprised of a tool set 22a, b, and c. Each tool set 22a, b, and c has an upper tool U1, 2, and 3; and a lower tool B1, 2, and 3 respectively. The leadframe transport carousel 20 is positioned between the upper and lower tools U1-3 and B1-3 when in the in-tool position. Those skilled in the art will recognize that, as previously discussed herein, the number of tool sets 22 is variable depending on the number of tool-drives 12 in a desired embodiment.

The stack unit 28 is comprised of five leadframe magazines M which can be in one of the following positions: 34, 36, 38, 40, 42 or 44 (shown more clearly in FIG. 1). Positioned atop the leadframe magazines M at position 34 and 44 (shown more clearly in FIG. 1) are the on-load buffer 30, and the off-load buffer 32 respectively. The stack unit 28 is also comprised of the leadframe transport carousel 20 and support and drive equipment 26, the details of which are not shown herein, but may be accomplished in a variety of methods by those skilled in the art.

Referring to FIG. 1, a perspective top view of the leadframe transport carousel 20 and on-load and off-load buffers 30 and 32 of the present invention in a preferred embodiment are shown. The on-load buffer 30 is supplied with to-be-processed leadframes 200 from the magazine M at position 34. The off-load buffer 32 deposits processed leadframes 300 sequentially into the magazine M on position 44.

The actual operational sequence is that from the magazine M at position 34 the on-load buffer 30 will be filled with to-be-processed leadframes 200. From the top of the on-load buffer 30 the to-be-processed leadframes 200 are picked-up and placed into one of the leadframe handler assemblies G1-6. The leadframes transport carousel 20 transports the leadframe handler assemblies Gl-6, with the to-be-processed leadframes 200 in them, through the tool-drive(s) 12 (see FIG. 2). The leadframe handler assembly Gl-6 is transported by the leadframe transport carousel 20 till the leadframe handler assembly G1-6 is above the off-load buffer 32, the leadframe handler assembly G1-6 will release the now processed leadframe 300 into the off-load buffer 32.

At the moment that the last to-be-processed leadframe 200 is moved into the on-load buffer 30 from the magazine M beneath it, the first processed leadframe 300 is still in the bottom of the off-load buffer 32. i.e. because both the on-load buffer 30 and the off-load buffer 32 are longer than half a magazine M, at the point when the on-load buffer 30 has just received the last to-be-processed leadframes 200 from the magazine M beneath it, the quantity of to-be-processed leadframes 200 in the buffer 30 will constitute one half of the capacity of a magazines M. Therefore, the remaining leadframes, both to-be-processed and processed will be either on the leadframe transport carousel 20, or in the off-load buffer 32. This is the moment that the now empty magazine M at position 34 moves to position 44 beneath the off-load buffer 32.

Following the shift of the magazine M the remainder of the to-be-processed leadframes 200 are transported through the tool-drives 12, processed into processed leadframes 300, which are transported back to a position above the off-load buffer 32 where they are released into the off-load buffer 32, which in turn places the processed leadframes 300 into the magazine M at position 44. This is a very unique feature of this leadframe transport in that the processed leadframes 300 are placed back in the same magazine M they were in when they were to-be-processed leadframes 200.

At the moment that the magazine M at position 34 has moved to position 44 the magazines M at position 36 and 38 move to position 34 and 36. A new magazines, M with to-be-processed leadframes 200, is now under the on-load buffer 30 ready to supply new to-be-processed leadframes 200 for processing. Now the magazine M at position 40 will move to position 38 (see FIG. 2).

When the processed leadframes 300 are all in the magazine M at position 44, the to-be-processed leadframes 200 in the new magazine M at position 34 are in process and the magazines M on position 42 and 44 move to position 40 and 42 (see FIG. 2).

In this fashion the on-load and off-load buffers 30 and 32 are to kept supplied and emptied respectively. The on-load buffer 30 supplies to-be-processed leadframes 200 to the leadframe transport carousel 20 above it. As shown, leadframe handler assemblies G2-3, located in the process area 220, are gripping to-be-processed leadframes 200a–b previously loaded from the on-load buffer 200. Leadframe handler assembly G1, located at the right end of the process area 220 and leadframe handler assemblies G4-6, located in the return area 330, are shown gripping processed leadframes 300a–d respectively which the leadframe transport carousel 20 will deposit into the off-load buffer 32 beneath the leadframe transport carousel 20.

In the way described above the magazine transport (not shown herein) is also a carousel. The start situation is with magazines M at the positions 34, 36, 38, 40 and 42 filled with to-be-processed leadframes 200. After five magazine carousel cycles there are five magazines M at the positions 36, 38, 40, 42 and 441 filled with processed leadframes 300 with a unique feature being that all the processed leadframes 300 are in the same magazine M they were in when they were to-be-processed leadframes 200.

The leadframe transport carousel 20 (see FIG. 1). is preferably comprised of: a main track 70 having leadframe handler tracks 82 and 80; an on-load turning point assembly 56 having leadframe handler tracks 72 and 74 and a turning point drive shaft 58; an off-load turning point assembly 54 having leadframe handler tracks 76 and 78 and a turning point drive shaft 60; a plurality of leadframe handler assemblies G1-6 coupled to the leadframe transport carousel 20 each having a release mechanism R1-6 respectively, wherein each release mechanism R1-6 detachably couples each leadframe handler assembly G1-6 to leadframe handler tracks 72, 74, 76, 78, 80 and 82 of the leadframe transport carousel 20; and pitch strips 50 and 52 that are positioned, alongside the main track 70 which serve to pickup and advance each of the leadframe handler assemblies G1-6 a pitch position at a time as indexed by the main drive unit 14 (see FIGS. 2–3). The leadframe transport carousel 20 is adapted and configured to move a plurality of leadframe handler assemblies G1-6 sequentially through at least one tool-drive 22 (see FIGS. 2–3) within a process area 220, and then through a return area 330. The sequential movement of the leadframe transport carousel 20 is indexed with the tool-drives 12a–c operation by a mechanical drive (not shown herein) from the main drive unit 14 main shaft (not shown) as will be understood by those well skilled in the art.

Referring now to FIGS. 4–8, and 4a–8a, planar views of a preferred embodiment of the leadframe transport carousel 20 in sequential positions are shown. FIGS. 4–8 show an top view of the leadframe transport carousel 20 as it is indexed through a sequence of process pitch movements. FIGS. 4a–8a show corresponding side views of the leadframe transport carousel 20 from the off-load turning point assembly 54 end as it is indexed through a sequence of process pitch movements.

Referring to FIGS. 4–4a, the leadframe transport carousel 20 is at rest. Leadframe handler assemblies G4-6 are shown coupled to the leadframe handler track 80; and leadframe handler assemblies G1-3 are shown coupled to the leadframe handler track 82; the pitch strip 50 is lowered (see FIG. 4a) and positioned to the on-load end overlapping the on-load turning point assembly 56; the pitch strip 52 is also lowered (see FIG. 4a) and positioned to the off-load end overlapping the off-load turning point assembly 54.

Referring to FIGS. 5–5a, the leadframe transport carousel 20 is shown initiating an indexed process pitch sequence. The pitch strips 50 and 52 rise up (see FIG. 5a) and lift the leadframe handler assemblies G1-6 off of the leadframe handler tracks 80 and 82 to which they were coupled by the release mechanisms R1-6.

Referring to FIGS. 6–6a, the pitch strip 50 indexes one process pitch length to the right, towards the off-load turning point assembly 54 (see FIG. 6) thus placing the leadframe handler assembly G1 over the off-load turning point assembly 54 and advancing leadframe handler assemblies G2-3 one process pitch position to the right; and at the same time, the pitch strip 52 indexes one process pitch length to the left, towards the on-load turning point assembly 56 thus placing the leadframe handler assembly G4 over the on-load turning point assembly 56 and advancing leadframe handler assemblies G6-5 one process pitch position to the left. Simultaneously with the process pitch movement of the pitch strips 50 and 52 in their upper position, both the on-load and off-load turning point drive shafts 58 and 60 rotate in the counter-clockwise direction 180°.

Figures 7, 7A:
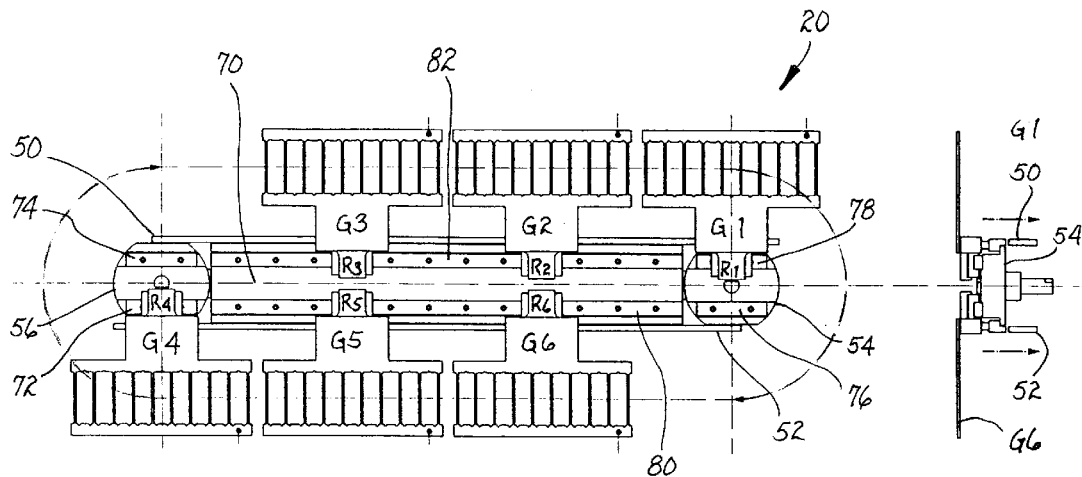

Referring to FIGS. 7–7a, the pitch strips 50 and 52 now descend; and the leadframe handler assemblies' G2-3—release mechanisms R2-3 couple to the leadframe handler track 82; the leadframe handler assembly's G1—release mechanism R1 couples to the leadframe handler track 78 which is atop the off-load point turning assembly 54; the leadframe handler assembly's G6—5 release mechanisms R6-5 couple to the leadframe handler track 80; and the leadframe handler assembly's G4—release mechanism R4 couples to the leadframe handler track 72 which is atop the on-load point turning assembly 56.

Figures 8, 8A:
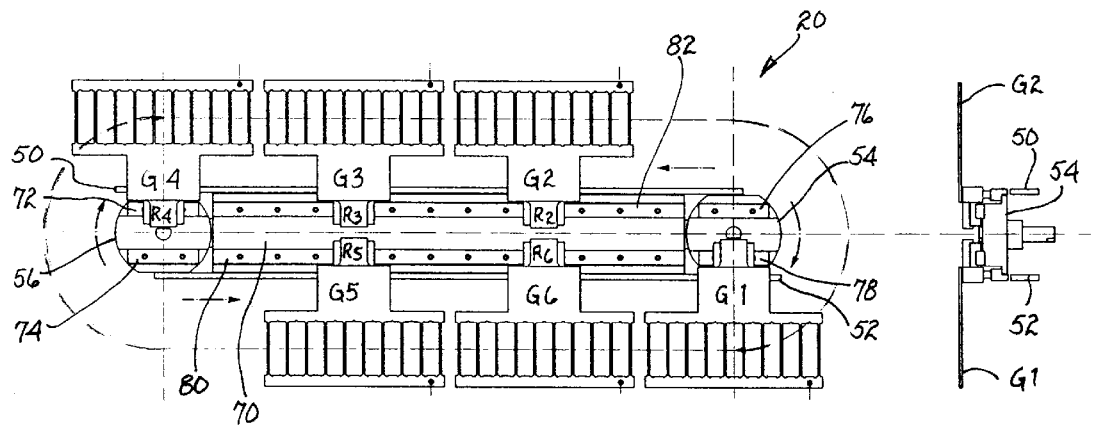

Referring to FIGS. 8–8a, the pitch strip 50 indexes one process pitch length to the left (see FIG. 8), towards the on-load turning point assembly 56 thus positioning the pitch strip 50 for the start of the next indexing sequence; and the pitch strip 52 indexes one process pitch length to the right, towards the off-load turning point assembly 54 thus positioning the pitch strip 53 for the start of the next indexing sequence. During this time frame in which the pitch strips 50 and 52 are moving, the off-load point turning assembly 54 rotates 180° clockwise thus rotating the attached leadframe handler assembly Gl out of the process area 220 (see FIG. 1) and into the return area 330 (see FIG. 1); and the on-load point turning assembly 56 rotates 180° clockwise thus rotating the attached leadframe handler assembly G4 out of the return area 330 (see FIG. 1) and into the process area 220 (see FIG. 1).

The pitch strips 50 and 52 and the turning point assemblies 54 and 56 are now ready for another indexed process pitch sequence. As previously discussed for FIGS. 5–5a and 6–6a, the pitch strips 50 and 52 will again rise and lift the leadframe handler assembly G1 off of the leadframe handler track 78, leadframe handler assemblies G6-5 off of the leadframe handler track 80, leadframe handler assembly G4 off of the leadframe handler track 72, and leadframe handler assemblies G3-2 off of the leadframe handler track 82 to which the leadframe handler assemblies G1-6 were coupled by the release mechanisms R1-6.

Although the invention has been particularly shown and described with reference to a preferred embodiment thereof, it will be understood by those skilled in the art that changes in form and detail may be made therein without departing from the spirit and scope of the invention.

What is claimed is:

1. An independent leadframe transport system for use with an integrated-circuit processing unit, comprising, in combination:
    a main drive unit having at least one tool-drive;
    a stack unit moveably coupled to the main drive unit for storing unprocessed and processed leadframes; and
    a leadframe transport carousel coupled to the stack unit so that the transport carousel moves with the stack unit which loads an unprocessed leadframe from a container in the stack unit and returns a processed leadframe back to the container in the stack unit.

2. The system of claim 1 wherein the stack unit is translationally coupled to the main drive unit so that the leadframe transport carousel may be selectively positioned within the at least one tool-drive in an in-tool position and without the at least one too-drive in an out-tool position.

3. The system of claim 1 wherein the leadframe transport carousel comprises:
    a plurality of leadframe handler assemblies coupled to the leadframe transport carousel; and
    a with the phrase means for loading an unprocessed leadframe from the stack unit on to one of the plurality of leadframe handler assemblies and for releasing a processed leadframe back to the stack unit.

4. The system of claim 3 where each leadframe handler assembly further comprises a release mechanism detachably coupling each leadframe handler assembly to the leadframe transport carousel.

5. The system of claim 3 wherein the leadframe transport carousel is adapted and configured to move the plurality of leadframe handler assemblies sequentially through the at least one tool-drive within a process area and through a return area where the processed leadframe is returned back to the stack unit.

6. The system of claim 3 wherein the leadframe transport carousel further comprises a main track assembly wherein the plurality of leadframe handler assemblies are coupled thereto.

7. The system of claim 6 further comprising pitch strips coupled to the main track assembly.

8. The system of claim 7 further comprising an on-load turning point assembly and an off-load turning assembly.

9. The system of claim 1 wherein each of the at least one tool drive has an upper tool and a lower tool, the stack unit being translationally coupled to the main drive unit so that the leadframe transport carousel may be selectively positioned between the upper tool and the lower tool of each of the at least one tool-drive in an in-tool position and out of the upper tool and the lower tool of each of the at least one tool-drive in an out-tool position.

10. The system of claim 1 wherein the container is a magazine carousel coupled to the stack unit.

11. The system of claim 10 wherein the magazine carousel comprises:
    a plurality of magazines located on the magazine carousel wherein each magazine will house a processed leadframe, the processed leadframes being loaded into the same magazine that housed the processed leadframe prior to the processed leadframe being processed;
    an on-load buffer to supply unprocessed leadframes to the leadframe transport carousel from one of the plurality of magazines; and
    an off-load transport carousel which deposits the processed leadframes into one of the plurality of magazines.

12. The system of claim 11 wherein the magazine carousel further comprises:
    means for positioning one of the plurality of magazines containing unprocessed leadframes beneath the on-load buffer until the one of the plurality of magazines containing unprocessed leadframes is empty of the unprocessed leadframes; and
    means for positioning the one of the plurality of magazines containing unprocessed leadframes beneath the off-load buffer to receive the processed leadframes.

13. An independent leadframe transport system for use with an integrated-circuit processing unit, comprising, in combination:
    a main drive unit having at least one tool-drive;
    a stack unit moveably coupled to the main drive unit for storing unprocessed and processed leadframes; and
    a leadframe transport carousel coupled to the stack unit so that the transport carousel moves with the stack unit wherein the stack unit is translationally coupled to the main drive unit so that the leadframe transport carousel may be selectively positioned within the at least one tool-drive in an in-tool position and without the at least one too-drive in an out-tool position;

means coupled to the leadframe transport carousel for loading an unprocessed leadframe from the stack unit and returning a processed leadframe back to the stack unit;

a plurality of leadframe handler assemblies coupled to the leadframe transport carousel for transporting processed leadframes and unprocessed leadframes around the leadframe transport carousel; and a magazine carousel coupled to the stack unit.

14. The system of claim 13 wherein the means is a means for loading which loads an unprocessed leadframe from the stack unit on to one of the plurality of leadframe handler assemblies and releases a processed leadframe back to the stack unit.

15. The system of claim 13 where each leadframe handler assembly further comprises a release mechanism detachably coupling each leadframe handler assembly to the leadframe transport carousel.

16. The system of claim 13 wherein the leadframe transport carousel is adapted and configured to move the plurality of leadframe handler assemblies sequentially through the at least one tool-drive within a process area and through a return area where the processed leadframe is returned back to the stack unit.

17. The system of claim 13 wherein the leadframe transport carousel further comprises a main track assembly wherein the plurality of leadframe handler assemblies are coupled thereto.

18. The system of claim 17 further comprising pitch strips coupled to the main track assembly.

19. The system of claim 18 further comprising an on-load turning point assembly and an off-load turning assembly.

20. The system of claim 13 wherein each of the at least one tool drive has an upper tool and a lower tool, the stack unit being translationally coupled to the main drive unit so that the leadframe transport carousel may be selectively positioned between the upper tool and the lower tool of each of the at least one tool-drive in an in-tool position and out of the upper tool and the lower tool of each of the at least one tool-drive in an out-tool position.

21. The system of claim 13 wherein the magazine carousel comprises:

a plurality of magazines located on the magazine carousel wherein each of the magazines are adapted to receive at least one of the un processed and processed leadframes;

an on-load buffer to supply unprocessed leadframes to the leadframe transport carousel from one of the plurality of magazines; and an off-load transport carousel which deposits the processed leadframes into one of the plurality of magazines.

22. The system of claim 21 wherein the magazine carousel further comprises:

means for positioning one of the plurality of magazines containing unprocessed leadframes beneath the on-load buffer until the one of the plurality of magazines containing unprocessed leadframes is empty of the unprocessed leadframes; and means for positioning the one of the plurality of magazines containing unprocessed leadframes beneath the off-load buffer to receive the processed leadframes.

* * * * *